(12) United States Patent
Bai et al.

(10) Patent No.: US 8,388,800 B2
(45) Date of Patent: Mar. 5, 2013

(54) APPARATUS FOR WET PROCESSING SUBSTRATE

(75) Inventors: Yao-Wen Bai, Shenzhen (CN); Pan Tang, Shenzhen (CN); Xiao-Ping Li, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 345 days.

(21) Appl. No.: 12/766,903

(22) Filed: Apr. 25, 2010

(65) Prior Publication Data

US 2011/0024042 A1 Feb. 3, 2011

(30) Foreign Application Priority Data

Jul. 28, 2009 (CN) .......................... 2009 1 0304889

(51) Int. Cl.
*C23F 1/08* (2006.01)
(52) U.S. Cl. ..................... 156/345.21; 134/48; 134/131; 134/151
(58) Field of Classification Search ............... 156/345.2, 156/345.21, 345.18; 134/902, 48, 131, 151
See application file for complete search history.

(56) References Cited

U.S. PATENT DOCUMENTS

| | | | | |
|---|---|---|---|---|
| 3,896,827 | A | * | 7/1975 | Robinson ..................... 134/10 |
| 4,296,769 | A | * | 10/1981 | van der Lugt ................ 134/68 |
| 5,335,681 | A | * | 8/1994 | Schmid ...................... 134/64 R |
| 5,335,682 | A | * | 8/1994 | Yoshimura et al. ............. 134/72 |
| 6,142,500 | A | * | 11/2000 | Sargent ..................... 280/405.1 |
| 2003/0150381 | A1 | | 8/2003 | Seifert |
| 2009/0211611 | A1 | * | 8/2009 | Berner et al. .................. 134/48 |
| 2009/0314739 | A1 | * | 12/2009 | Yang et al. ..................... 216/13 |
| 2011/0024042 | A1 | * | 2/2011 | Bai et al. .................. 156/345.21 |

\* cited by examiner

*Primary Examiner* — Sylvia R. MacArthur
(74) *Attorney, Agent, or Firm* — Altis Law Group, Inc.

(57) ABSTRACT

An exemplary wet processing apparatus includes a conveyor, a spraying system, and a suction system. The conveyor is configured for conveying a substrate. The spraying system includes an upper spraying conduit above the conveyor and an upper spraying nozzle mounted on the upper spraying conduit. The suction system includes a suction conduit and a suction nozzle connected to the suction conduit. The suction nozzle is adjacent to the conveyor and configured for suction the wet processing liquid sprayed on the substrate. The suction conduit is connected to the spraying conduit in such a manner that the flowing of the wet processing liquid in the upper spraying conduit can create a negative pressure in the suction conduit to enable the suction nozzle to suck the wet processing liquid on the substrate.

14 Claims, 4 Drawing Sheets

APPARATUS FOR WET PROCESSING SUBSTRATE

BACKGROUND

1. Technical Field

The present disclosure generally relates to an apparatus for processing a substrate and particularly, to an apparatus for wet processing a printed circuit board (PCB).

2. Description of Related Art

In the manufacture of PCBs, it is normal practice to feed the boards through a series of processing machines via a conveyor system. The process includes resist stripping, pre-cleaning, etching, neutralizing, water rinsing, and drying. Pre-cleaning, etching, neutralizing, and water rinsing, are known as wet processing steps. In these wet processing steps, a spray system comprising at least one set of spray nozzles is arranged to face the conveyor system to spray wet processing liquid on PCBs on the conveyor system. For example, the spray system can spray etchant on the PCBs to form circuits therein.

However, a puddle of etchant is inevitably formed in a central portion of the PCB due to the fact that flow velocity of etchant in a peripheral portion of the PCB is faster than in the central portion of the PCB. This "puddle effect" leads to different etching rates in the central and peripheral portions of the PCB. In such case the accuracy of the circuits and the electrical properties of the PCBs are affected.

What is needed, therefore, is an apparatus for wet processing a substrate which can overcome the above-described problem.

BRIEF DESCRIPTION OF THE DRAWINGS

Many aspects of the present wet processing apparatus can be better understood with reference to the following drawings. The components in the drawings are not necessarily drawn to scale, the emphasis instead being placed upon clearly illustrating the principles of the present lens module. Moreover, in the drawings, all the views are schematic, and like reference numerals designate corresponding parts throughout the several views.

DETAILED DESCRIPTION

Reference will now be made to the drawings to describe in detail embodiments of the wet processing apparatus.

Figure 1:
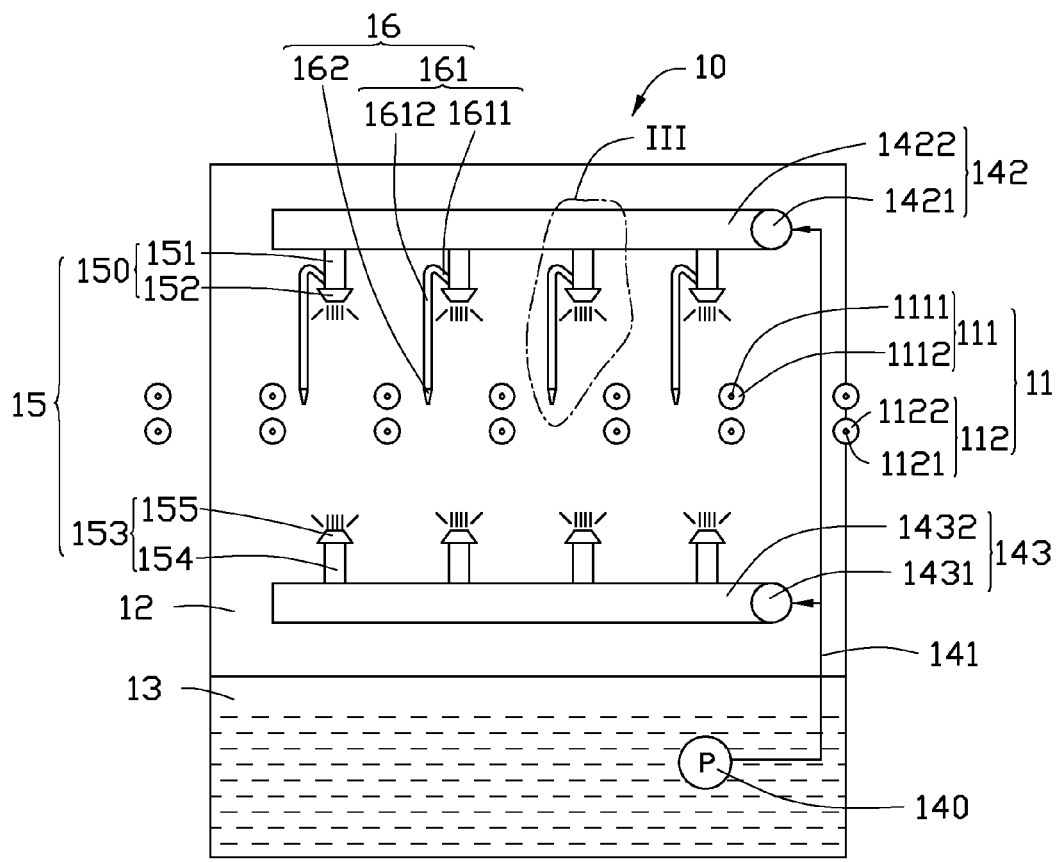
FIG. 1 is a front elevation view of a wet processing apparatus in accordance with an embodiment.
Figure 2:
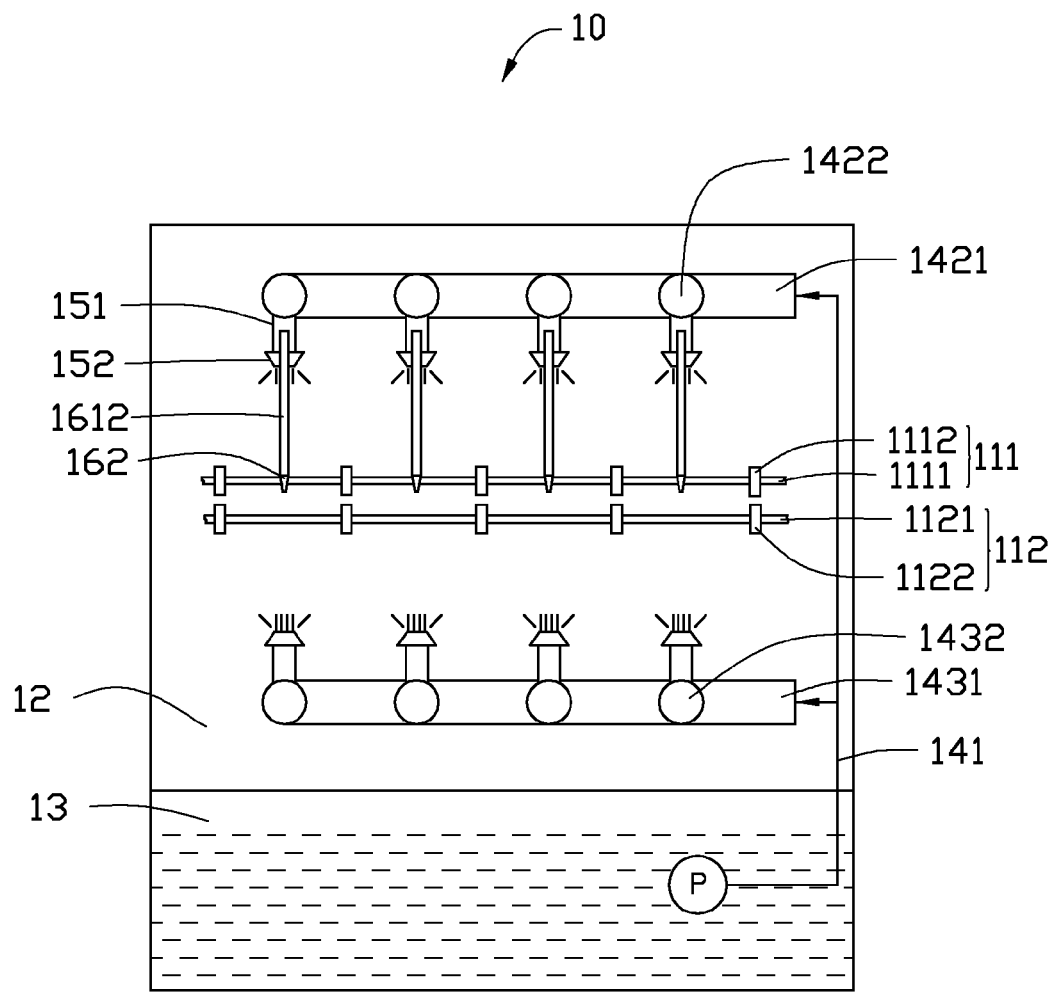
FIG. 2 is a left view of the wet processing apparatus of FIG. 1.

Referring to FIGS. 1 and 2, a wet processing apparatus 10 for wet processing a substrate with a wet processing liquid is shown. The apparatus 10 includes a conveyor 11, a housing 12, a tank 13, a liquid supplying system 14, a spraying system 15, and a suction system 16. The housing 12, the tank 13, the liquid supplying system 14, the spraying system 15, and the suction system 16 constitute a wet process work station through which the conveyor 11 extends. The conveyor 11 is configured for conveying substrates to pass through the wet process work station. For example, the wet process work station can be an etching work station, and a substrate can be placed on the conveyor 11 and delivered to the etching work station to form circuits therein. Portions of the conveyor 11, the liquid supplying system 14, the spraying system 15, and the suction system 16 are accommodated in the housing 12, which is arranged above the tank 13. The tank 13 communicates with the housing 12, and is configured for receiving/collecting a wet processing liquid, such as an etchant. The liquid supplying system 14 is configured for supplying the wet processing liquid in the tank 13 to the spraying system 15. The spraying system 15 is arranged on two opposite sides of the conveyor 11, and is configured for spraying the wet processing liquid onto two opposite surfaces of the substrate delivered on the conveyor 11. The suction system 16 is arranged adjacent to the conveyor 11, and is configured for sucking up the wet processing liquid sprayed on a top surface of the substrate.

The conveyor 11 includes a number of spaced upper rollers 111 and a number of spaced lower rollers 112. The upper rollers 111 are equidistantly arranged along a direction of which the substrate is conveyed. Each upper roller 111 has an upper rotating shaft 1111 and a number of upper rotating wheels 1112 equidistantly mounted on the upper rotating shaft 1111 along a longitudinal direction thereof. A central axis of the upper rotating shaft 1111 is coaxial with central axes of the upper rotating wheels 1112. The upper rotating shafts 1111 can be mechanically connected to a motor to rotate the upper rotating shafts 1111 and the upper rotating wheels 1112. The lower rollers 112 correspond to the upper rollers 111 one by one, and are also equidistantly arranged along the direction of which the substrate is conveyed. Each lower roller 112 has a lower rotating shaft 1121 and a number of lower rotating wheels 1122 equidistantly mounted on the lower rotating shaft 1121 along a longitudinal direction thereof. A central axis of the lower rotating shaft 1121 is coaxial with central axes of the lower rotating wheels 1122, and is parallel with the central axis of the upper rotating shafts 1111. The lower rotating shafts 1121 can be mechanically connected to another motor to rotate the lower rotating shafts 1121 and the lower rotating wheels 1122. It is noted that a rotating direction of the upper rotating wheels 1112 is reverse to that of the lower rotating wheels 1122. Thus, if a substrate is placed between the upper rotating wheels 1112 and the lower rotating wheels 1122, the substrate can be moved along by the rotating of the upper and lower rotating wheels 1112, 1122.

The liquid supplying system 14 includes a pump 140, a connecting channel system 141, an upper supplying system 142, and a lower supplying system 143. The pump 140 is disposed in the tank 13, and is immerged in the wet processing liquid and configured for pumping the wet processing liquid to the connecting channel system 141. The connecting channel system 141 is in communication with the pump 140, the upper supplying system 142, and the lower supplying system 143, and is configured for supplying the wet processing liquid to the upper supplying system 142 and the lower supplying system 143. The upper supplying system 142 includes an upper main pipe 1421 and a number of spaced upper distributing pipes 1422. The upper main pipe 1421 is substantially parallel with the upper rotating shafts 1111. The upper distributing pipes 1422 are equidistantly arranged above the conveyor 11, and are perpendicularly connected to the upper main pipe 1421. That is, each of the upper distributing pipes 1422 is substantially parallel with the direction of substrate conveyance. The lower supplying system 143 includes a lower main pipe 1431 and a number of spaced lower distributing pipes 1432. The lower main pipe 1431 is substantially parallel with the upper main pipe 1421. The lower distributing pipes 1432 are equidistantly arranged below the conveyor 11, and are perpendicularly connected to the lower main pipe 1431 and substantially parallel with the upper distributing pipes 1422.

It is noted that the number of the upper and lower distributing pipes 1422, 1432 is not limited. It is also noted that the upper and lower main pipe 1421, 1431 may be omitted according to circumstance in other embodiments. In other words, the upper supplying system 142 can have just one upper distributing pipe 1422, which is communicated with the connecting channel system 141, and the lower supplying system 143 can include just one lower distributing pipe 1432 which is communicated with the connecting channel system 141.

The spraying system 15 is mounted on the liquid supplying system 14. Specifically, the spraying system 15 includes an upper spraying device 150 above the conveyor 11 and a lower spraying device 153 below the conveyor 11.

Figure 3:
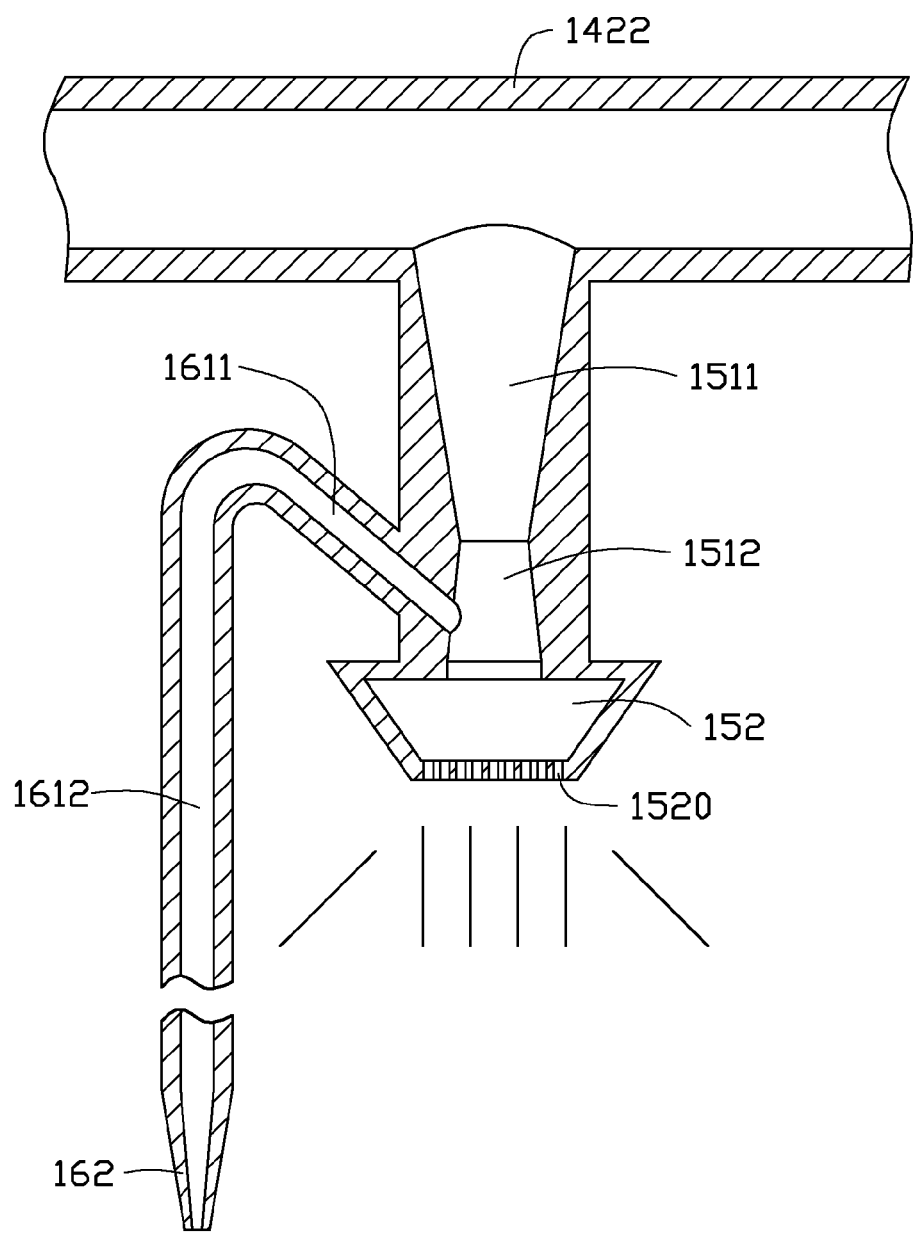
FIG. 3 is an enlarged cross-sectional sectional view of the area III that is circled in a dot-and-dash pattern in FIG. 1.
Figure 4:
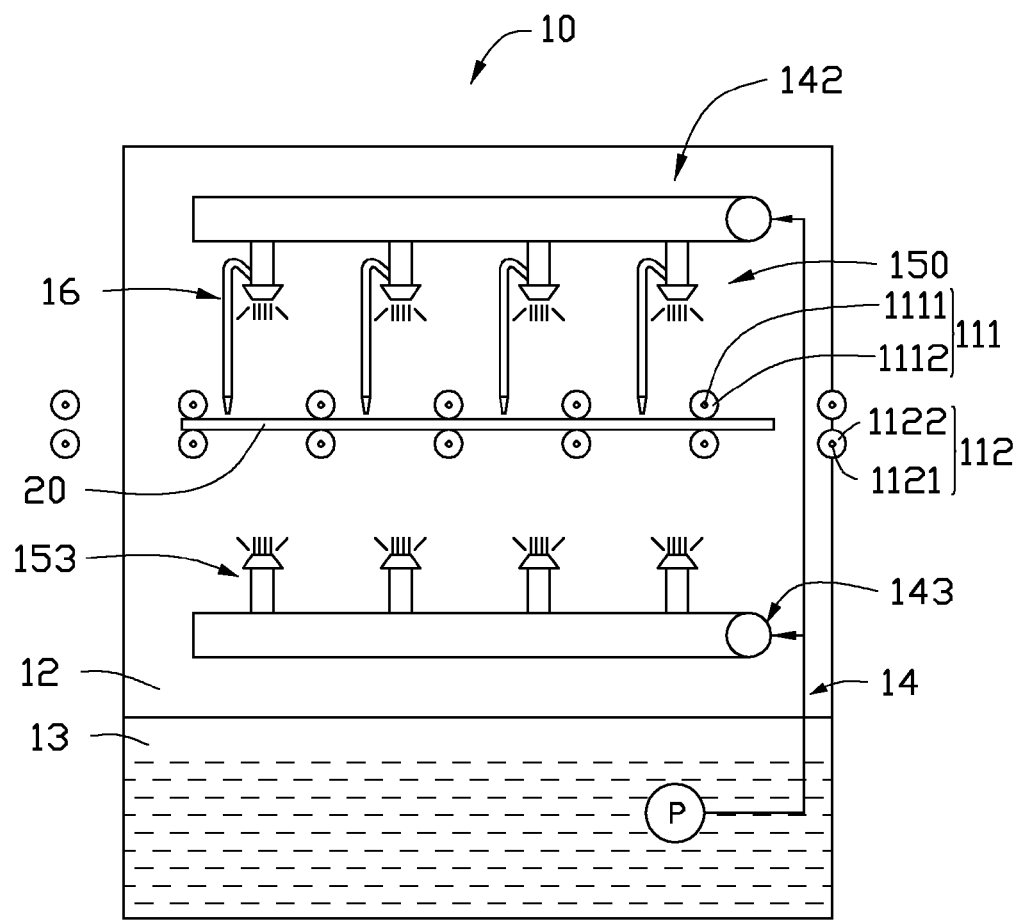
FIG. 4 is similar to FIG. 1, but showing the wet processing apparatus processing a substrate.

The upper spraying device 150 includes a number of upper spraying conduits 151 and a number of upper spraying nozzles 152. The upper spraying nozzles 152 correspond to the upper spraying conduits 151 one by one. Each of the upper distributing pipes 1422 has at least one upper spraying conduit 151 mounted thereon. The upper spraying conduits 151 are perpendicular to the upper distributing pipes 1422 and the upper main pipe 1421. In other words, the upper spraying conduits 151 are perpendicular to a top surface of the substrate on the conveyor 11 and the direction of substrate conveyance. The upper spraying conduits 151 are configured for supplying the wet processing liquid from the upper distributing pipes 1422 to the upper spraying nozzles 152. The upper spraying nozzles 152 are configured for spraying the wet processing liquid from the upper spraying conduits 151 to the top surface of the substrate on the conveyor 11. In the illustrated embodiment, each of the upper spraying nozzles 152 has a trapezoidal cross section, and has a number of openings 1520 defined therein, as shown in FIG. 3. The openings 1520 are communicated with the corresponding upper spraying conduit 151 and are configured for spraying the wet processing liquid therefrom.

Referring to FIG. 3, each of the upper spraying conduits 151 has a first exporting tube 1511 coaxial to a second exporting tube 1512. The first exporting tube 1511 is connected and communicated with a corresponding upper distributing pipe 1422. The first exporting tube 1511 is connected to and communicated with a corresponding upper spraying nozzle 152 by the second exporting tube 1512. The upper spraying conduits 151 each have a varied inside diameter. In detail, an inside diameter in the first exporting tube 1511 decreases from the end connected to the upper distributing pipe 144 to the other end connected to the second exporting tube 1512, and an inside diameter in the second exporting tube 1512 increases from the end connected to the first exporting tube 1511 to the other end connected to the corresponding spraying nozzle 152. The largest inside diameter of the second exporting tube 1512 is less than that of the first exporting tube 1511. In other words, the upper spraying conduit 151 is a Venturi tube with the minimum inside diameter in a joint portion of the first and second exporting tubes 1511, 1512, with pressure in the second exporting tube 1512 lower than in the first exporting tube 1511.

The lower spraying device 153 includes a number of lower spraying conduits 154 corresponding to the upper spraying conduits 151 one by one and a number of lower spraying nozzles 155 corresponding to the lower spraying conduits 154 one by one. Each lower distributing pipe 1432 has at least one lower spraying conduit 154 mounted thereon. The lower spraying conduits 154 are parallel to the upper spraying conduits 151. In the illustrated embodiment, each lower spraying conduit 154 is mounted opposite to a corresponding upper spraying conduit 151, and has a corresponding lower spraying nozzle 155 mounted thereon. The lower spraying conduits 154 are configured for supplying the wet processing liquid from the lower distributing pipes 1432 to the lower spraying nozzles 155. In the illustrated embodiment, an inside diameter of the lower spraying conduit 154 can be kept constant. The lower spraying nozzles 155 have similar structures to that of the upper spraying nozzles 152, and are configured for spraying the wet processing liquid from the lower spraying conduits 154 to a bottom surface of the substrate on the conveyor 11.

It is understood that the lower spraying device 153 may be omitted according to circumstance in other embodiments due to that some kinds of substrates only need to form circuits in one side thereof. It is also understood that the number of the upper spraying conduits 151 and the upper spraying nozzles 152 is not limited. In other words, the spraying system 15 can include just upper spraying device 150, which can include just one upper spraying conduit 151 and one corresponding spraying nozzle 152.

The suction system 16 is mounted on the upper spraying device 150, and is configured for suction the wet processing liquid sprayed on the top surface of the substrate. The suction system 16 includes a number of suction conduits 161 corresponding to the upper spraying conduits 151 one by one and a number of suction nozzles 162 corresponding to the suction conduits 161 one by one. The suction conduits 161 each include a first suction tube 1611 and a second suction tube 1612. Each first suction tube 1611 is connected and communicated with a corresponding second exporting tube 1512 of a corresponding spraying conduit 151. Each second suction tube 1612 is connected and communicated between a corresponding first suction tube 1611 and a corresponding suction nozzle 162.

Specifically, each second suction tube 1612 is parallel to the corresponding upper spraying conduit 151. Each first suction tube 1611 is obliquely extends from the corresponding second exporting tube 1512 to the first second suction tube 1612. In other words, an angle between a central axis of the first suction tube 1611 and a central axis of the second suction tube 1612 is an acute angle. The acute angle can be in the range from about 30 degrees to about 70 degrees. In the illustrated embodiment, the acute angle is about 60 degrees.

The suction nozzles 162 are arranged adjacent and above the lower rollers 112. In detail, each of the suction nozzles 162 is disposed between two neighboring upper rollers 111. A distance between the suction nozzles 162 and the substrate on the conveyor 11 is in the range from 0 to about 5 millimeters. That is, a distance between the suction nozzles 162 and a bottom side of the upper rollers 111 is in the range from 0 to about 5 millimeters. In another embodiment, the distance between the suction nozzles 162 and the substrate on the conveyor 11 is in the range from 0 to about 2 millimeters. Each of the suction nozzles 162 has a decreased inside diameter and outside diameter from the end connected to the second suction tube 1612 to the end distal from the second suction tube 1612.

In the illustrated embodiment, because the upper spraying conduits 151 are venturi tubes, when the wet processing liquid flows through, a pressure in the second exporting tubes 1512 is decreased. Then a pressure in the suction conduits 161 and the suction nozzles 162 is decreased, thus that the suction nozzles 162 can suck up the wet processing liquid sprayed on the substrate. That is, the flowing of the wet processing liquid in the upper spraying conduit 151 can create a negative pressure in the suction conduit 161 to enable the suction nozzle 162 to suck the wet processing liquid on the substrate. And the wet processing liquid sucked up by the suction nozzles 162 can flow through suction conduits 161 to the second exporting tubes 1512 and finally to spraying nozzles 152. That is, in the illustrated embodiment, the suction system 16 can suck the unwanted wet processing liquid on the substrate, therefore "puddle effect" on the substrate can be avoided.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A wet processing apparatus, comprising:
a conveyor configured for conveying a substrate;
a spraying system arranged opposite to the conveyor, the spraying system comprising
an upper spraying conduit and an upper spraying nozzle mounted on the upper spraying conduit, the upper spraying conduit being configured for supplying a wet processing liquid to the upper spraying nozzle, the upper spraying nozzle being configured for spraying the wet processing liquid to an upper side of the substrate; and
a suction system comprising a suction conduit and a suction nozzle connected to the suction conduit, the suction nozzle being adjacent to the conveyor and configured for suction the wet processing liquid sprayed on the substrate, the suction conduit being connected to and in communication with the upper spraying conduit in such a manner that the flowing of the wet processing liquid in the upper spraying conduit create a negative pressure in the suction conduit to enable the suction nozzle to suck the wet processing liquid sprayed by the upper spraying nozzle on the substrate, wherein the upper spraying conduit is perpendicular to the substrate on the conveyor, the suction conduit comprises a first suction tube connected to the upper spraying conduit and a second suction tube connected to the suction nozzle, the second suction tube is parallel to the upper spraying conduit, the first suction tube obliquely extends from the upper spraying conduit to the second suction tube, the upper spraying conduit comprises a first exporting tube and a second exporting tube coaxial with each other, the second exporting tube is connected between the first exporting tube and the upper spraying nozzle, the inside diameter of the first exporting tube decreases from the end distal from the second exporting tube to the other end connected to the second exporting tube, the inside diameter of the second exporting tube increases from the end connected to the first exporting tube to the other end connected to the upper spraying nozzle, and the first suction tube is connected to the second exporting tube.

2. The wet processing apparatus of claim 1, further comprising a liquid supplying system, the liquid supplying system comprising a pump, a connecting channel system, and an upper supplying system, the pump being configured for pumping the wet processing liquid to the connecting channel system, the connecting channel system being in communication with the pump and the upper supplying system, the upper supplying system being in communication with the upper spraying conduit, and being configured for supplying the wet processing liquid to the upper spraying conduit.

3. The wet processing apparatus of claim 2, further comprising a tank below the conveyor, the tank being configured for receiving the wet processing liquid, the pump being arranged in the tank and immerged in the wet processing liquid.

4. The wet processing apparatus of claim 3, further comprising a housing above the tank, the spraying system, the suction system, the liquid supplying system, and portions of the conveyor being accommodated in the housing.

5. The wet processing apparatus of claim 2, wherein the spraying system further comprises a lower spraying conduit and a lower spraying nozzle below the conveyor, the liquid supplying system further comprises a lower supplying system communicating with the connecting channel system, the lower spraying conduit communicates with the lower supplying system, the lower spraying nozzle is mounted on the lower spraying conduit and opposite to the upper spraying nozzle, the lower spraying nozzle is configured for spraying the wet processing liquid to a lower side of the substrate.

6. The wet processing apparatus of claim 1, wherein a central axis of the first suction tube and a central axis of the second suction tube intersect at an acute angle.

7. The wet processing apparatus of claim 1, wherein the largest inside diameter of the second exporting tube is less than that of the first exporting tube.

8. The wet processing apparatus of claim 1, wherein the conveyor comprises a plurality of spaced upper rollers and a plurality of spaced lower rollers, the upper rollers are arranged along a direction of substrate conveyance, the lower rollers spatially correspond to the respective upper rollers, each of the lower rollers and the corresponding upper roller are configured for conveying a substrate therebetween.

9. The wet processing apparatus of claim 1, wherein a central axis of the first suction tube and a central axis of the second suction tube intersect at an acute angle.

10. A wet processing apparatus, comprising:
a conveyor configured for conveying a substrate;
a spraying system arranged opposite to the conveyor, the spraying system comprising a plurality of upper spraying conduits and a plurality of upper spraying nozzles corresponding to the respective upper spraying conduits, each of the upper spraying conduits being a venturi tube, each of the upper spraying nozzles being mounted on a corresponding upper spraying conduit and being configured for spraying a wet processing liquid supplied by the corresponding upper spraying conduit to an upper side of the substrate; and
a suction system comprising a plurality of suction conduits corresponding to the respective spraying conduits and a plurality of suction nozzles corresponding to the respective suction conduits, the suction nozzles being adjacent to the conveyor and configured for suction the wet processing liquid sprayed on the substrate, each of the suction conduits being connected between and in communication with a corresponding upper spraying conduit and a corresponding suction nozzle in such a manner that when the wet processing liquid flows through the corresponding spraying conduit, a negative pressure in the suction conduit is created to enable the corresponding suction nozzle to suck the wet processing liquid sprayed by the upper spraying nozzle on the substrate, wherein the upper spraying conduits are perpendicular to the substrate on the conveyor, each of the suction conduits comprises a first suction tube connected to the corresponding upper spraying conduit and a second suction tube connected to the corresponding suction nozzle, the second suction tube is parallel to the corresponding upper spraying conduit, the first suction tube obliquely extends from the corresponding upper spraying conduit to the second suction tube, each of the upper spraying conduits comprises a first exporting tube and a second exporting tube coaxial with each other, the second exporting tube is connected between the first exporting tube and the corresponding upper spraying nozzle, the inside diameter of the first exporting tube decreases from the end distal from the second exporting tube to the other end connected to the second exporting tube, the inside diameter of the second exporting tube increases from the end connected to the first exporting tube to the other end connected to the corresponding upper spraying nozzle, and the first suction tube is connected to the second exporting tube.

11. The wet processing apparatus of claim 10, further comprising a liquid supplying system, the liquid supplying system comprising a pump, a connecting channel system, and an upper supplying system, the pump being configured for pumping the wet processing liquid to the connecting channel system, the connecting channel system being in communication with the pump and the upper supplying system, the upper supplying system being in communication with the upper spraying conduits, and being configured for supplying the wet processing liquid to the upper spraying conduits.

12. The wet processing apparatus of claim 11, further comprising a tank below the conveyor, the tank being configured for receiving the wet processing liquid, the pump being arranged in the tank and immerged in the wet processing liquid.

13. The wet processing apparatus of claim 12, further comprising a housing above the tank, the spraying system, the suction system, the liquid supplying system, and portions of the conveyor being accommodated in the housing.

14. The wet processing apparatus of claim 11, wherein the spraying system further comprises a plurality of lower spraying conduits and a number of lower spraying nozzles below the conveyor, the liquid supplying system further comprises a lower supplying system communicated with the connecting channel system, the lower spraying conduits each communicate with the lower supplying system, the lower spraying nozzles correspond to the lower spraying conduits respectively, and each are mounted on a corresponding lower spraying conduit, the lower spraying nozzles are configured for spraying the wet processing liquid to a lower side of the substrate.

* * * * *